US008501136B2

(12) United States Patent
Qin et al.

(10) Patent No.: US 8,501,136 B2
(45) Date of Patent: Aug. 6, 2013

(54) SYNTHESIS AND PROCESSING OF RARE-EARTH BORIDE NANOWIRES AS ELECTRON EMITTERS

(75) Inventors: Lu-Chang Qin, Chapel Hill, NC (US); Han Zhang, Ibaraki (JP); Qi Zhang, State College, PA (US); Jie Tang, Chapel Hill, NC (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 613 days.

(21) Appl. No.: 12/223,639

(22) PCT Filed: Feb. 6, 2007

(86) PCT No.: PCT/US2007/003040
§ 371 (c)(1),
(2), (4) Date: Sep. 25, 2009

(87) PCT Pub. No.: WO2008/054451
PCT Pub. Date: May 8, 2008

(65) Prior Publication Data
US 2010/0028235 A1 Feb. 4, 2010

Related U.S. Application Data

(60) Provisional application No. 60/765,643, filed on Feb. 6, 2006.

(51) Int. Cl.
| C01F 17/00 | (2006.01) |
| C01B 25/08 | (2006.01) |
| C01B 35/00 | (2006.01) |
| B32B 9/00 | (2006.01) |
| D02G 3/00 | (2006.01) |
| C30B 25/00 | (2006.01) |
| F21V 9/06 | (2006.01) |
| H01B 1/08 | (2006.01) |
| H01B 1/02 | (2006.01) |
| H01B 1/00 | (2006.01) |

(52) U.S. Cl.
USPC ........... 423/263; 423/289; 423/276; 428/366; 428/364; 428/397; 117/88; 252/587; 252/518.1; 252/519.1; 252/511; 252/500

(58) Field of Classification Search
None
See application file for complete search history.

(56) References Cited

U.S. PATENT DOCUMENTS
2,639,399 A    5/1953  Lafferty et al.
3,766,427 A  * 10/1973  Coates et al. ................. 315/382

(Continued)

FOREIGN PATENT DOCUMENTS
WO     WO2008/054451      5/2008

OTHER PUBLICATIONS

Zou et al.; Large Scale Synthesis of Neodymium Hexaboride Nanowire by Self-Catalyst; Solid State Communications; 141, 53-56; 2007.*

(Continued)

*Primary Examiner* — Melvin Curtis Mayes
*Assistant Examiner* — Guinever Gregorio
(74) *Attorney, Agent, or Firm* — Jenkins, Wilson, Taylor & Hunt, P.A.

(57) ABSTRACT

A method for preparing single-crystalline, rare-earth metal hexaboride nanowires by a chemical vapor deposition process is described. Also described are the nanowires themselves, the electron emitting properties of the nanowires, and the use of the nanowires in electron emitting devices, particularly as point electron sources.

32 Claims, 14 Drawing Sheets

(56) References Cited

U.S. PATENT DOCUMENTS

| | | | |
|---|---|---|---|
| 3,932,314 | A | 1/1976 | Kawabe et al. |
| 4,030,963 | A | 6/1977 | Gibson et al. |
| 4,054,946 | A | 10/1977 | Ferris et al. |
| 4,260,525 | A | 4/1981 | Olsen et al. |
| 4,346,325 | A | 8/1982 | Nakasuji et al. |
| 4,727,287 | A | 2/1988 | Aida et al. |
| 5,235,188 | A * | 8/1993 | Mul ............................ 250/311 |
| 5,277,932 | A | 1/1994 | Spencer |
| 5,773,921 | A | 6/1998 | Keesmann et al. |
| 6,025,038 | A | 2/2000 | Dowben et al. |
| 6,306,776 | B1 | 10/2001 | Srinivasan et al. |
| 6,350,488 | B1 | 2/2002 | Lee et al. |
| 6,903,499 | B2 | 6/2005 | Terui et al. |
| 2004/0173378 | A1 | 9/2004 | Zhou et al. |

OTHER PUBLICATIONS

Zhang et al.; Single Crystalline LaB6 Nanowires; J.Am.Chem.Soc.; 127, 2862-2863; Feb. 11, 2005.*

Motojima et al.; Chemical Vapor Growth of LaB6 Whiskers and Crystals Having a Sharp Tip; Journal of Crystal Growth; vol. 44, Issues 1, pp. 106-109; 1978.*

Zhou et al.; Single Crystalline GdB6 Nanowire Field Emitters; J.A. Chem. Soc.; 127, 13120-13121; 2005.*

Givargizov, E.I., and Obolenskaya, L.N., "Controlled growth of $LaB_6$ whiskers by the vapor-liquid-solid mechanism," Journal of Crystal Growth. vol. 51, No. 2 pp. 190-194 (1981) [Abstract].

Givargizov, E.I. and Obolenskaya, L.N., "Regular arrays of $LaB_6$ whiskers grown on singlecrystal substrates by the vapour-liquid-solid method," Journal of the Less Common Metals. vol. 117, Nos. 1-2 pp. 97-103 (1986) [Abstract].

Madou, "Fundamentals of Microfabrication," CRC Press. Boca Raton, Florida. pp. 111-112 (1997).

Motojima et al., "Chemical Vapor Growth of $LaB_6$ Whiskers and Crystals Having a Sharp Tip," Journal of Crystal Growth. vol. 44, No. 1 pp. 106-109 (1978).

Nakamoto, M., and Fukuda, K., "Field electron emission from $LaB_6$ and TiN emitter arrays fabricated by transfer mold technique," Applied Surface Science. vol. 202, Nos. 3-4 pp. 289-294 (2002) [Abstract].

Notification Concerning Transmittal of International Preliminary Report on Patentability (Chapter I of the Patent Cooperation Treaty) corresponding to International Patent Application No. PCT/US2007/003040 mailed Aug. 21, 2008.

Notification of Transmittal of the International Search Report and the Written Opinion of the International Searching Authority, or the Declaration corresponding to International Patent Application No. PCT/US2007/003040 mailed May 14, 2008.

Wang et al., "Low-Temperature Synthesis of Single-Crystal Germanium Nanowires by Chemical Vapor Deposition," Angew. Chem. Int. Ed. vol. 41, No. 24 pp. 4783-4786 (2002).

Zhang at al., "Efficient Fabrication of Carbon Nanotube Point Electron Sources by Dielectrophoresis," Advanced Materials. vol. 16, No. 14 pp. 1219-1222 (2004).

Zhang et al., "Field Emission of Electrons from Single $LaB_6$ Nanowires," Advanced Materials. vol. 18 pp. 87-91 (2006).

Zhang et al., "$LaB_6$ Nanowires and Their Field Emission Properties," Materials Research Society. Paper # 0901-Rb15-0 (2005) [Abstract].

Zhang et al., "Single-Crystalline $CeB_6$ Nanowires," Journal of the American Chemical Society. vol. 127, No. 22 pp. 8002-8003 (2005).

Zhang et al., "Single-Crystalline $GdB_6$ Nanowire Field Emitters," Journal of the American Chemical Society. vol. 127, No. 38 pp. 13120-13121 (2005).

* cited by examiner

SYNTHESIS AND PROCESSING OF RARE-EARTH BORIDE NANOWIRES AS ELECTRON EMITTERS

RELATED APPLICATIONS

The presently disclosed subject matter claims the benefit of U.S. Provisional Patent Application Ser. No. 60/765,643, filed Feb. 6, 2006; the disclosure of which is incorporated herein by reference in its entirety.

TECHNICAL FIELD

The presently disclosed subject matter relates to methods of synthesizing and processing single-crystalline nanowires comprising rare-earth metals and boron. The presently disclosed subject matter also relates to the nanowires themselves, their electron emission properties, and to the use of the nanowires as electron emitters.

ABBREVIATIONS

° C.=degrees Celsius
CCD=charge-coupled device
$CeB_6$=cerium hexaboride
CVD=chemical vapor deposition
F-N=Fowler-Nordheim
$GdB_6$=gadolinium hexaboride
HRTEM=high-resolution transmission electron microscope
ITO=indium tin oxide
$LaB_6$=lanthanum hexaboride
μm=micrometer
nA=nanoampere
nm=nanometer
SAED=selected-area electron diffraction
SEM=scanning electron microscope
Si=silicon
TEM=transmission electron microscope
V=volts
W=tungsten
ZrO=zirconium oxide

BACKGROUND

Electron emitters continue to find new applications as sources of electrons in a wide range of devices including: flat panel displays, klystrons and travelling wave tubes, lamps, ion guns, miniature X-ray tubes, electron-beam lithography systems, high energy accelerators, free electron lasers and electron microscopes and microprobes. Accordingly, there is an ongoing interest in the development of electron emitter sources having improved performance capabilities. Further, the method of manufacturing the electron emitter (e.g., a cathode) should be inexpensive and adaptable to being incorporated into a wide range of device applications.

Thermionic emission involves an electrically charged particle emitted by an incandescent substance. Photoemission releases electrons from a material by energy supplied by the incidence of radiation. Secondary emission occurs by bombardment of a substance with charged particles such as electrons or ions. Electron injection involves the emission from one solid to another. Field emission is a quantum tunneling process and refers to the emission of electrons due to the application of a high electric field.

It has recently been found that field emission sources such as electron guns comprising tungsten (W) or tungsten/zirconium oxide (W/ZrO) can provide longer service life and higher brightness than electron guns using cathodes comprising thermionic electron sources. Further, field emission devices do not require the use of high temperatures, which can be a source of problems in thermionic emission devices. For instance, heating tends to reduce cathode life, introduces warm-up delays, and can require bulky ancillary equipment (e.g., cooling systems).

The emission characteristics of a metal field emitter are largely dependent on two factors, the work function of the metal and the shape of the emitter. In particular, field emission is most easily obtained from sharply pointed needles or tips whose ends have been smoothed into a nearly hemispherical shape by heating. As an electric field is applied, the electric lines of force diverge radially from the tip and the emitted electron trajectories initially follow these lines of force.

Accordingly, conventional cathode materials for field emission devices are typically made of metal (such as Mo) or semiconductor material (such as Si) with sharp, nanometer-sized tips. While useful emission characteristics have been demonstrated for these materials, the control voltage required for emission can be high because of the high work functions of these materials. The high voltage operation increases the damaging instabilities caused by ion bombardment and surface diffusion on the emitter tips and necessitates high power densities to be supplied from an external source to produce the required emission current density. In addition, the fabrication of uniform sharp tips is often difficult, tedious and expensive, especially over a large area. Fabrication of such fine tips normally requires extensive fabrication facilities to tailor the emitter into the desired shape. Moreover, the vulnerability of these materials in a real device operating environment to phenomena such as ion bombardment, reaction with chemically active species, and temperature extremes is also a concern.

Attempts to provide improved emitter materials have shown that certain carbon-based materials are potentially useful. For example, diamond and carbon nanotubes materials have been investigated.

Other potentially attractive electron emission materials are the rare-earth borides, in particular rare-earth metal hexaborides, such as lanthanum hexaboride. The rare-earth metal hexaborides are known for having very low work functions, high melting temperatures, and low vapor pressures. Depending on the crystal plane of the lanthanum hexaboride emitter surface, a work function of as low as about 2.5 eV has been reported. See U.S. Pat. No. 4,727,287 to Aida, et al.

One characteristic which has prevented the wide-range use of lanthanum hexaboride as thermionic emitter materials is its highly reactive nature at high operating temperatures. Thus, most supporting members will react with lanthanum hexaboride to cause deterioration of the supporting members. Therefore, the lifetime of such cathodes is disadvantageously short. Further, in order to provide reasonably small emitter tips (e.g., 5-200 μm diameter), micromachining processes (e.g., electro-etching) are required. See U.S. Pat. No. 6,903,499 to Terui, et al.

Accordingly, there is a need in the art for improved electron emitters, particularly field emission emitters. Also needed are methods which reduce the complexity of fabricating such emitters.

SUMMARY

In some embodiments, the presently disclosed subject matter provides a single-crystalline, rare-earth metal boride nanowire. In some embodiments, the nanowire is a single-crystalline, rare-earth metal hexaboride nanowire. In some embodiments, the rare-earth metal is selected from the group consisting of Sc, Y, La, Ce, Pr, Nd, Sm, Eu, Gd, Tb, Dy, Ho, Er, Tm, Yb, and Lu. In some embodiments, the rare-earth metal is selected from the group consisting of La, Ce, Sm, Y, and Gd.

In some embodiments, the nanowire has a lateral dimension of 200 nm or less. In some embodiments the lateral dimension is 100 nm or less. In some embodiments, the lateral dimension is 60 nm or less. In some embodiments, the lateral dimension is 20 nm or less.

In some embodiments, the nanowire has a longitudinal dimension of 100 nm or more. In some embodiments, the nanowire has a longitudinal dimension of 1 µm or more. In some embodiments, the longitudinal dimension is 10 µm or more.

In some embodiments, the nanowire has a lattice orientation selected from the group consisting of <001>, <110>, <111>, <112> and <113>.

In some embodiments, the nanowire tip is terminated by one or more facets, wherein at least one of the one or more facets comprises a lattice plane selected from the group consisting of a {100} plane, a {001} plane, a {110} plane, a {111} plane, a {112} plane, and a {113} plane.

In some embodiments, the nanowire comprises a hemispherically-shaped tip. In some embodiments, the tip terminates in a plurality of facets.

In some embodiments, the nanowire comprises a flat tip. In some embodiments, the tip terminates in a single facet. In some embodiments, the flat tip is square-shaped or rectangular-shaped.

In some embodiments, the presently disclosed subject matter provides a method of preparing a single-crystalline, rare-earth metal hexaboride nanowire, the method comprising:
providing a first gas comprising $M(X^1)_3$, wherein M is a rare-earth metal and $X^1$ is a halide;
providing a second gas, wherein the second gas comprises $B(X^2)_3$, wherein $X^2$ is a halide;
providing a substrate; and
contacting the first and second gases at a first temperature for a first period of time in the presence of a third gas, said third gas comprising hydrogen gas, whereby single-crystalline, rare-earth metal hexaboride nanowires deposit on the substrate.

In some embodiments, providing the first gas comprises providing a solid comprising $M(X^1)_3$, and vaporizing the solid to form the first gas. In some embodiments, the vaporizing is done in the presence of the second and third gases.

In some embodiments, $X^1$ is Cl. In some embodiments, $X^2$ is Cl.

In some embodiments, the first temperature is between about 800° C. and about 1500° C. In some embodiments, the first temperature is between about 1125° C. and about 1150° C.

In some embodiments, the first period of time is less than one hour. In some embodiments, the first period of time is between about 2 minutes and about 7 minutes.

In some embodiments, the third gas comprises between 5% hydrogen gas by volume and 100% hydrogen gas by volume. In some embodiments, the third gas further comprises nitrogen gas. In some embodiments, the third gas comprises 5% hydrogen gas ($H_2$) by volume in nitrogen gas.

In some embodiments, M is selected from the group consisting of La, Gd, Y, Sm, and Ce.

In some embodiments, the contacting is done in a tube furnace.

In some embodiments, the contacting takes place at a pressure between about 0.05 atm and about 1 atm. In some embodiments, the contacting takes place at a pressure of about 0.1 atm.

In some embodiments, the substrate comprises a material selected from the group consisting of silicon, doped silicon, metal, metal alloy, glass, graphite, diamond, ceramic, and mixtures thereof. In some embodiments, the substrate is coated with metal. In some embodiments, the substrate is coated with a metal selected from the group consisting of gold, iron, nickel, cobalt and platinum. In some embodiments, the substrate is silicon or metal-coated silicon. In some embodiments, the substrate is selected from the group consisting of silicon, gold-coated silicon, and platinum-coated silicon.

In some embodiments, the method further comprises providing a catalyst, wherein the catalyst comprises one of the group consisting of a transition metal, a noble metal and combinations thereof.

In some embodiments, the presently disclosed subject matter provides an electron emission cathode comprising an electron emitter, said electron emitter comprising a single-crystalline, rare-earth metal hexaboride nanowire.

In some embodiments, the field emission current of a single nanowire is approximately 10 nA or more at an applied voltage of 800 V or less. In some embodiments, the field emission current of a single nanowire is approximately 50 nA or more at an applied voltage of 750 V or less.

In some embodiments, the field emission current is 150 nA or more at an average applied field of 3.2 V/µm or less.

In some embodiments, the presently disclosed subject matter provides an apparatus comprising an electron source, wherein the electron source comprises a single-crystalline, rare-earth metal hexaboride nanowire. In some embodiments, the apparatus is selected from the group consisting of a transmission electron microscope, a scanning electron microscope, a scanning transmission electron microscope, an electron-beam lithographic system, a flat panel display system, and a focused ion beam system.

It is an object of the presently disclosed subject matter to provide single crystalline rare-earth metal hexaboride nanowires for use as electron emitters.

An object of the presently disclosed subject matter having been stated hereinabove, and which is achieved in whole or in part by the presently disclosed subject matter, other objects will become evident as the description proceeds when taken in connection with the accompanying drawings as best described hereinbelow.

DETAILED DESCRIPTION

Figure 1:
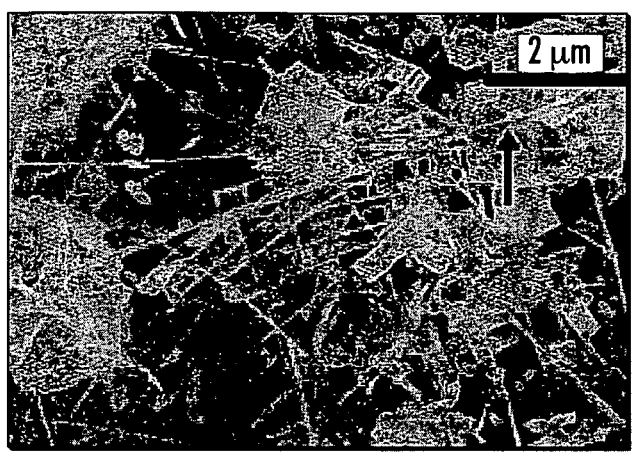
FIG. 1 is a scanning electron microscope (SEM) image of single-crystalline $LaB_6$ nanowires synthesized according to the presently disclosed chemical vapor deposition (CVD) method on a silicon substrate. The arrow indicates a cube-shaped $LaB_6$ crystal deposited on the substrate adjacent to a nanowire.

The presently disclosed subject matter will now be described more fully hereinafter with reference to the accompanying Examples, in which representative embodiments are shown. The presently disclosed subject matter can, however, be embodied in different forms and should not be construed as limited to the embodiments set forth herein. Rather, these embodiments are provided so that this disclosure will be thorough and complete, and will fully convey the scope of the embodiments to those skilled in the art.

Unless otherwise defined, all technical and scientific terms used herein have the same meaning as commonly understood by one of ordinary skill in the art to which this presently described subject matter belongs. All publications, patent applications, patents, and other references mentioned herein are incorporated by reference in their entirety.

Throughout the specification and claims, a given chemical formula or name shall encompass all optical and stereoisomers, as well as racemic mixtures where such isomers and mixtures exist.

I. DEFINITIONS

Following long-standing patent law convention, the terms "a", "an", and "the" refer to "one or more" when used in this application, including the claims. Thus, for example, reference to "a nanowire" includes mixtures of one or more nanowires, two or more nanowires, and the like.

Unless otherwise indicated, all numbers expressing quantities of ingredients, reaction conditions, nanowire lengths, nanowire diameters, and so forth used in the specification and claims are to be understood as being modified in all instances by the term "about". Accordingly, unless indicated to the contrary, the numerical parameters set forth in the present specification and attached claims are approximations that can vary depending upon the desired properties sought to be obtained by the presently disclosed subject matter.

The term "about", as used herein when referring to a measurable value such as an amount of weight, length, width, time, percentage, temperature, etc. is meant to encompass in one example variations of ±20% or ±10%, in another example ±5%, in another example ±1%, and in yet another example ±0.1% from the specified amount, as such variations are appropriate to perform the disclosed methods.

As used herein, a "nanostructure" is a structure having at least one region or characteristic dimension with a dimension of less than about 500 nm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanocrystals, nanotetrapods, tripods, bipods, nanocrystals, nanodots, quantum dots, nanoparticles, branched tetrapods (e.g., inorganic dendrimers), and the like. In some embodiments the nanostructures can be substantially homogenous in material properties. In some embodiments, the nanostructures can be, for example, substantially crystalline or substantially monocrystalline.

A "nanowire" is a nanostructure that has one principle axis that is longer than the other two principle axes. Consequently, the nanowire has an aspect ratio (length:width) greater than one. In some embodiments, a nanowire can have an aspect ratio greater than about 1.5 or greater than about 2. Short nanowires, sometimes referred to as nanorods, can have an aspect ratio between about 1.5 and about 10. Longer nanowires can have an aspect ratio greater than about 10, greater than about 20, greater than about 50, or greater than about 100, or even greater than about 10,000. The lateral dimension of a nanowire is typically less than about 500 nm, less than about 200 nm, less than about 150 nm, or less than about 100 nm. In some embodiments, the nanowire can have a lateral dimension of about 50 nm, or of about 20 nm, or even less than about 10 nm or about 5 nm.

The term "longitudinal dimension" refers to the length of a nanowire along its longest axis.

As used herein, the term "lateral dimension" can refer to the diameter of a nanowire having a circular shaped tip and/or cross-section. In the case of a nanowire having a square or rectangular-shaped tip and/or cross-section, the lateral dimension can be the measurement of the length of one of the sides of the square or rectangle or can be the measurement across the nanowire tip or cross-section from any point on one of the sides to a point on one of the other sides. Thus, the term "lateral dimension" can refer to a width of the nanowire.

The term "nanowire tip" refers to a terminating surface of the nanowire that is substantially perpendicular to the nanowire's longitudinal axis.

The terms "single-crystalline," "monocrystalline," and "single-crystal" refer to a crystal having long range ordering, with axes that have the same direction at different parts of the crystal. The terms "single-crystalline" and "single-crystal" can also refer to crystals that are substantially single-crystalline, for example, wherein the crystal axes have the same direction along at least 80%, 85%, 90%, 95% or more of the length of the crystal. In some instances, a nanostructure, such as a nanowire, can comprise a crystal further comprising an oxide or other coating, or comprising a core and a shell. In these instances it will be appreciated that the oxide, shell(s), or other coating will not have long range ordering and can be amorphous, polycrystalline, or otherwise. In these instances, the terms "single-crystalline" and "single-crystal" can refer to the central core of the nanostructure, excluding the coating layers or shells. In addition, it will be appreciated that the interface between a core and the outside of a nanostructure or between a core and an adjacent shell or between a shell and a second adjacent shell can contain non-crystalline regions and can even be amorphous. This does not prevent the nanostructure (e.g., the nanowire) from being single-crystalline or substantially single-crystalline as defined herein.

The term "rare-earth metal" or "rare-earth element" as used herein refers to elements including scandium, yttrium, members of the lanthanide series, and members of the actinide series. Thus, in some embodiments, the rare earth metal can be selected from the group consisting of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), actinium (Ac), thorium (Th), protactinium (Pa), uranium (U), neptunium (Np), plutonium (Pu), americium (Am), curium (Cm), berkelium (Bk), californium (Cf), einsteinium (Es), fermium (Fm), mendelevium (Md), nobelium (No), and lawrencium (Lr). In some embodiments, the rare-earth metal is selected from the group consisting of La, Gd, Ce, Y, and Sm.

II. RARE-EARTH METAL HEXABORIDES

The attractive thermionic emission properties of the rare-earth hexaborides and their use as cathode materials have been known since the 1950s. In particular, rare-earth metal hexaborides have low work function, high melting temperature, and low vapor pressure. See U.S. Pat. No. 4,054,946 to Ferris, et al. For example, $LaB_6$ prepared by arc melting of compacted $LaB_6$ powder has been used as a thermionic electron source in scanning electron microscopes. See U.S. Pat. No. 4,030,963 to Gibson, et al.

Reports of methods for the synthesis of rare-earth hexaborides include U.S. Pat. No. 2,639,399 to Lafferty, which describes reacting a rare-earth metal with amorphous boron at a temperature of 1375° C. to 1850° C. Other synthesis methods include arc synthesis, Czochralski growth, arc zone melting, and aluminum flux techniques. See U.S. Pat. No. 4,054,946 to Ferris, et al; and U.S. Pat. No. 4,260,525 to Olsen, et al. More recently, U.S. Pat. No. 6,025,038 to Dowben, et al. describes a light-induced deposition method for forming rare-earth borides on the surface of a substrate submerged in an organic solution containing borane and a rare-earth halide.

While the low work function of the rare-earth metal hexaborides is certainly advantageous, according to the presently disclosed subject matter, one method of providing an improved rare-earth hexaboride electron emitter is to provide an emitter having smaller dimensions, particularly for use as a field emission emitter. Field emission current density can be expressed by the zero temperature Fowler-Nordheim (F-N) equation (1):

$$J=1.5\times10^{-6}(E^2/\phi))\exp[(10.4/\phi^{1/2})-(6.44\times10^7\phi^{3/2}/E)] \quad (1)$$

where J is the electronic current density expressed in A/cm$^2$; $\phi$ is the work function of the field emission cathode, and E is the local electric field applied on the cathode tip. E can also be expressed as E=V/5r with V being the applied voltage and r being the radius of the cathode tip. See Zhang, et al., *Adv. Mater.*, 18, 91-95 (2006). As indicated by the F-N equation, the smaller the emitter tip, the larger the electronic current density of the emitter.

Additionally, for a rod-shaped field emitter, the local electric field, F, which extracts electrons from the emitter tip can be determined from equation (2):

$$F=1.2V(2.5+h/r)^{0.9}[1+0.013d/(d-h)-0.033(d-h)/d]/d \quad (2)$$

where V is the applied voltage, r is the emitter tip radius, h is the longitudinal length of the emitter and d is the distance between the anode and the substrate where the emitter stands. Accordingly, the smaller the radius of the emitter tip and the larger the aspect ratio, h/r, the greater the local electric field will be. With a larger local electric field, electron emission will occur at a lower applied voltage compared to an emitter made of the same material but having larger dimensions. See Zhang, et al., *J. Am. Chem. Soc.*, 127, 2862-2863 (2005).

The tip diameters of commercial LaB$_6$ thermionic electron guns are typically in the range of a few microns to a few tens of microns. As described hereinabove, electron emitter tips comprising lanthanum hexaboride and having diameters of between about 5 µm and about 200 µm have been prepared via electropolishing methods. See U.S. Pat. No. 6,903,499 to Terui, et al. Chemical vapor growth of LaB$_6$ single crystals has been described wherein square pyramidal crystals and micrometer thick whiskers of LaB$_6$ were prepared from a gas mixture of LaCl$_3$, BCl$_3$, H$_2$ and argon gases on a graphite substrate. See Motojimia, S., et al., *J. Cryst. Growth*, 44, 106-109, (1978). A transfer mold technique for providing LaB$_6$ emitters having tips with radii as small as 10 nm has also been reported. See Nakamoto, et al., *App. Surface Sci.*, 202, 289-294 (2002).

II.A. Single-Crystalline Rare-Earth Metal Nanowires

The presently disclosed subject matter provides a single-crystalline rare-earth metal hexaboride nanowire, i.e., a nanowire comprises a single-crystal of a material having the formula MB$_6$, wherein M is a rare-earth metal. In some embodiments, M is La, Ce, Y, Sm, or Gd.

In some embodiments, the nanowire has a lateral dimension of 200 nm or less. In some embodiments, the nanowire has a lateral dimension of 100 nm or less, 60 nm or less, or 20 nm or less. The longitudinal dimension of the nanowire can be from about 100 nm to more than about 1 micron. Thus, in some embodiments, the nanowire can have a longitudinal dimension of 100 nm, 250 nm, 500 nm, 750 nm, or 1 micron. In some embodiments, the nanowire can have a longitudinal dimension of more than 1 micron. For example, the nanowire can have a longitudinal dimension of 2, 3, 4, 5, 6, 7, 8, or 9 microns. In some embodiments, the nanowire can have a longitudinal dimension of 10 microns or more. Accordingly, the presently disclosed nanowire can have an aspect ratio such that the nanowire can serve as a useful electron emitter.

Rare-earth metal hexaboride has a roughly cubic crystal structure. In some embodiments, the rare-earth metal hexaboride has a crystal structure of point group Pm3m. In some embodiments, the nanowire comprises a rare-earth metal hexaboride crystal oriented in one of the <001>, <110> <111>, <112>, or <113> crystal lattice directions.

In some embodiments, the nanowire has a flat tip. The flat tip can comprise a single terminating facet. The tip can also comprise a plurality of terminating facets. In some embodiments, the nanowire has a hemispherically shaped tip, which can comprise a plurality of terminating facets.

In some embodiments, one or more of the nanowire tip facets comprises a lattice plane selected from the group including, but not limited to, a {100} plane, a {001} plane, a {110} plane, a {111} plane, a {112} plane, and a {113} plane. In some embodiments, for tips terminating in a plurality of facets, two or more of the facets each comprise a lattice plane independently selected from the group including, but not limited to, a {100} plane, a {001} plane, a {110} plane, a {111} plane, a {112} plane, and a {113} plane. Thus, in some embodiments, the tip terminates in one or more low indice plane. When the tip terminates in more than one facet, the majority of the facets, or the larger facets can comprise a low indice plane.

A rare-earth metal hexaboride nanowire or nanowires can be synthesized in a reaction generally expressed by equation (3):

$$2MX_3(g)+12BX_3(g)+21H_2(g)=2LaB_6(s)+42HX(g) \quad (3)$$

wherein M is a rare-earth metal and each X is independently a halide, selected from the group consisting of Cl, Br, I, and F. In some embodiments, each X is Cl. In some embodiments, the nanowire(s) can be prepared according to a chemical vapor deposition (CVD) method.

As will be understood by those of skill in the art, the chemical vapor deposition process can take place in any suitable deposition chamber. For example, the chamber can comprise materials that are essentially chemically and thermally inert to the CVD process. A suitable chamber can comprise a deposition chamber, one or preferably two or more gas inlets, a controller for controlling gas flow, a heating apparatus, and a controller for controlling the heating apparatus. The chamber can also include a gas outlet or outlets and a controller for controlling and/or measuring the pressure in the reaction chamber. The chamber can comprise a plurality of reaction zones. In some embodiments, the process can take place in a furnace, such as, for example, a tube furnace.

During the synthesis of the nanowires, the boron halide gas and the rare-earth metal halide gas are brought together in the presence of a gas comprising hydrogen gas (H$_2$). The hydrogen gas can be pure hydrogen gas. The hydrogen gas can be present as part of a mixture with nitrogen or another inert gas, such as argon. In some embodiments, the hydrogen gas is present in a given percentage by volume (i.e., 1%, 5%, 10%, 15%, 20%, 25%, 50%, 75% or more) in nitrogen gas. In some embodiments, the hydrogen gas is present as part of a mixture comprising between about 5% and about 99.99% hydrogen gas in nitrogen. In some embodiments, the hydrogen gas is present as part of a mixture comprising 5% hydrogen gas in nitrogen.

In some embodiments, the reaction can take place at a pressure between about 0.05 and about 1 atm. In some embodiments, the reaction can take place at about 0.1 atm. In some embodiments, the reaction can take place at approximately 1 atm.

During the synthesis, the gases can be heated to an elevated temperature for a period of time sufficient to allow nanowires to form. In some embodiments, the gases are heated to a temperature of between about 800° C. and about 1500° C. In some embodiments, the gases are heated to a temperature of between about 900° C. and about 1400° C. In some embodiments, the gases are heated to a temperature of between about 1050° C. and about 1200° C. In some embodiments, the gases are heated to a temperature of between about 1125° C. and 1150° C.

The period of time sufficient to allow the nanowires to form is generally less than about one hour. Thus, in some embodiments, the period of time sufficient to allow the gases to contact one another is less than about 60 minutes. In some embodiments, the period of time is less than about 30 minutes. In some embodiments, the period of time is less than about 15 minutes. In some embodiments, the period of time is between about one minute and about 10 minutes. In some embodiments, the period of time is between about 2 minutes and 7 minutes.

The rare-earth metal halide gas can be provided by vaporizing rare-earth metal halide powders or other solids comprising rare-earth metal halides. In some embodiments, the rare-earth metal halide powder is vaporized in the presence of the boron halide gas and the gas comprising hydrogen. As will be understood by one of skill in the art, the rare-earth metal halide can be vaporized from any suitable container. For instance, when the reaction is performed in a tube furnace, the rare-earth metal halide solid can be placed in a suitable container, including, but not limited to, a tantalum bowl or quartz boat, placed inside the tube furnace and vaporized. In some embodiments, the vaporizing can take place in one reaction zone in a tube furnace and the substrate can be present in another reaction zone in the tube furnace.

The nanowires can be deposited onto a substrate present within the furnace. In some embodiments, the substrate is placed downstream of the area where the gases are mixed. For example, the substrate can be placed downstream of the vaporizing container for the rare-earth metal halide. Downstream refers to the direction in which the gases are flowing. Suitable substrates include metals, semiconductors, ceramics, and the like. For instance, the substrate can comprise silicon, doped silicon, metal, metal alloy, metal-coated silicon, glass, graphite, quartz, diamond, refractory metals, and mixtures thereof. In some embodiments, the metal, semiconductor, ceramic or other substrate as described directly hereinabove is coated with a metal. Thus, in some embodiments, the substrate is gold film-coated, platinum-coated, iron-coated, nickel-coated, cobalt-coated, or noble metal-coated. In some embodiments, the substrate is silicon, gold film-coated silicon, platinum-coated silicon, or iron-coated silicon.

In some embodiments, the synthesis further comprises providing a catalyst. For example, a catalyst can be provided for initiating the growth and/or the deposition of the nanowires. Thus, in some embodiments, a catalyst comprising a powder or nanostructured particles of a metal or metal-comprising compound is provided. The catalyst can comprise a transition metal (i.e., an element from one of Groups 3 to 12 of the Periodic Table), including, but not limited to, iron (Fe), nickel (Ni), or cobalt (Co), or a combination thereof. The catalyst can comprise a noble metal, including, but not limited to, gold (Au), silver (Ag), platinum (Pt), tantalum (Ta), rhodium (Rh), or a combination thereof. The catalyst can also comprise a combination of a transition metal and a noble metal. The catalyst can be present on the surface of the substrate.

During the synthesis, cubic crystals and/or platelets of rare-earth metal hexaboride can be formed in addition to the nanowires. In some cases, a small amount of amorphous boron impurity can also be produced. The nanowires can be manually separated from this material. Remaining catalyst materials can be removed, if desired. For example, catalysts materials can be removed by etching (e.g., electro-etching). Some nanowires can be coated by a layer of amorphous boron. However, as described in the laboratory examples hereinbelow, the electron emitting properties of the nanowires is based primarily upon the electron emitting properties of the monocrystalline rare-earth metal hexaboride.

Once synthesized, the nanowires can be removed from the substrate, the morphology and electron emitting properties of the nanowires can be studied, for example, by various microscopy techniques, and the nanowires can be incorporated into a variety of devices.

II.B. Nanowire Electron Emitters

In some embodiments, the presently disclosed subject matter provides electron emitting material for use in field emission or thermionic emission applications. In some embodiments, the presently disclosed subject matter provides an electron emission cathode comprising an electron emitter wherein the electron emitter is a single-crystalline, rare-earth metal hexaboride nanowire. A single nanowire emitter can have a field emission current of between about 1 nA and 1 mA at an applied voltage of between about 100 V and about 800 V. In some embodiments, a single nanowire emitter has a field emission current of 10 nA or more at an applied voltage of 800 V or less. In some embodiments, the field emission current of a single nanowire emitter is 50 nA or more at an applied voltage of 750 V or less.

In some embodiments, the single nanowire emitter has an emission current density of about $1\times10^5$ A/cm$^2$ or more at an applied voltage of 800 V. In some embodiments, the nanowire emitter has an emission current density of $5\times10^5$ A/cm$^2$ at an applied voltage of 800 V.

In some embodiments, the nanowire emitter can produce a detectable emission current at an applied voltage of about 450 V.

In some embodiments, the tip of the electron emitter has a lateral dimension of less than 200 nm. In some embodiments, the electron emitter has a lateral dimension of less than 100 nm, less than 60 nm, or less than 20 nm.

While the electron emitting properties of rare-earth metal hexaboride nanowires can be attributed to the low work function of the rare-earth metal hexaborides, in general, as well as to the small lateral dimensions of the nanowires, further fine-tuning of the emitting properties of the presently disclosed nanowires can be done based upon the crystal orientation of the nanowire, and the identity of the lattice plane or planes that comprise the terminating facet or the majority of the terminating facets present at the nanowire emitting tip.

In some embodiments, the electron emitter comprises a single-crystalline, rare-earth hexaboride nanowire wherein the rare-earth metal hexaboride crystal is oriented in one of the <001>, <110>, <111>, <112>, or <113> lattice directions. In some embodiments, the rare-earth hexaboride is selected from the group consisting of $LaB_6$, $CeB_6$, $YB_6$, $SmB_6$, and $GdB_6$.

In some embodiments, the electron emitter has a flat tip, which can comprise a single terminating facet. In some embodiments, the electron emitter has a substantially hemispherically shaped tip, which can comprise a plurality of terminating facets. In some embodiments, one or more of the nanowire tip facets comprises a lattice plane selected from the group including, but not limited to, a {100} plane, a {001} plane, a {110} plane, a {111} plane, a {112} plane, and a {113} plane. In some embodiments, for tips terminating in a plurality of facets, two or more of the facets each comprise a lattice plane independently selected from the group consisting of a {100} plane, a {001} plane, a {110} plane, a {111} plane, a {112} plane, and a {113} plane.

In some embodiments, the presently disclosed subject matter provides an electron emission cathode comprising a single-crystalline, rare-earth metal hexaboride nanowire. The cathode can be constructed by attaching a nanowire onto a surface of a conducting material to which can be applied a voltage. For instance, the nanowire can be attached to the tip of a metal (e.g., W) wire. As will be understood by one of skill in the art, any suitable attachment approach can be used, such as soldering or using an adhesive material.

In some embodiments, a single nanowire emitter can be used to construct an electron emission cathode for use in an electron gun. In some embodiments, the nanowires can be used in arrays, such as for field array displays.

In some embodiments, the presently disclosed subject matter provides single-crystal, rare-earth metal hexaboride nanowires for use in electron emitter devices. As the result of their low work function and nanometer-sized dimensions, the presently disclosed nanowires can offer low driving voltage and high stability when compared with tungsten-based electron emitters currently in use. The electron emitters can be used in analytical instrumentation, electron beam lithographic systems, focused ion beam systems, and any other device where a high performance point electron source could be used. The small energy spread and high brightness of the presently disclosed nanowire emitters makes them particularly useful in high performance electron optical instrumentation where low chromatic aberration and high spatial resolution is desired, such as in transmission electron microscopes, scanning electron microscopes, and scanning transmission electron microscopes. In some embodiments, the presently disclosed rare-earth metal hexaboride electron emitters can be used in medical applications, for example, in X-ray tube application related to computed tomography, digital fluoroscopy and radiography. The nanowires of the presently disclosed subject matter can also be used to construct portable x-ray machines for use in the field.

EXAMPLES

The following Examples have been included to provide guidance to one of ordinary skill in the art for practicing representative embodiments of the presently disclosed subject matter. In light of the present disclosure and the general level of skill in the art, those of skill can appreciate that the following Examples are intended to be exemplary only and that numerous changes, modifications, and alterations can be employed without departing from the scope of the presently disclosed subject matter.

Methods and Materials $BCl_3$ gas (99.9%), and $CeCl_3$ (99.9%), $GdCl_3$ (99.99%), and $LaCl_3$ (99.99%) powders or solids were purchased from Aldrich Chemical Co. (Milwaukee, Wis., United States of America). Nanowire morphological analysis was carried out using a JEM-6300 scanning electron microscope (SEM, Japan Electron Optics, Ltd., Tokyo, Japan), an energy dispersive X-ray spectrometer (EDX, Kevex™ Sigma3, Thermo Fisher Scientific, Waltham, Mass., United States of America) and a JEM-2010F transmission electron microscope (Japan Electron Optics, Ltd., Tokyo, Japan) equipped with a Shottky field-emission gun and operated at 200 kV.

Example 1

Single-Crystalline $LaB_6$ Nanowires

The synthesis of $LaB_6$ nanowires is based on the following equation:

$$2LaCl_3(g)+12BCl_3(g)+21H_2(g)=2LaB_6(s)+42HCl(g).$$

The synthesis of $LaB_6$ nanowires can be conducted in a tube furnace operated at 1150° C. The $BCl_3$ gas was introduced to the reaction zone of the furnace via a stainless steel inlet tube. $LaCl_3$ powder was vaporized in a tantalum bowl placed inside the tube furnace. The synthesis was carried out at atmospheric pressure in the presence of 5% $H_2$ in nitrogen. Nanowires were deposited onto a metal, silicon, or metal film-coated silicon substrate (e.g., a gold film-coated silicon substrate), placed in the tube furnace downstream of the tantalum bowl. See Zhang, et al., *J. Am. Chem. Soc.*, 127, 2862-2863 (2005); and Zhang, et al., *Adv. Mater.*, 18, 87-91 (2006).

Following deposition sing a silicon wafer as a substrate, $LaB_6$ nanowires having lateral dimensions ranging form the tens of nanometers to more than 100 nm were observed via scanning electron microscopy. See FIG. 1. The $LaB_6$ nanowires had lengths of up to a few micrometers or longer. Along with the nanowires, some nano- and micrometer-sized $LaB_6$ cubes and platelets were also deposited on the substrate.

Figure 2:
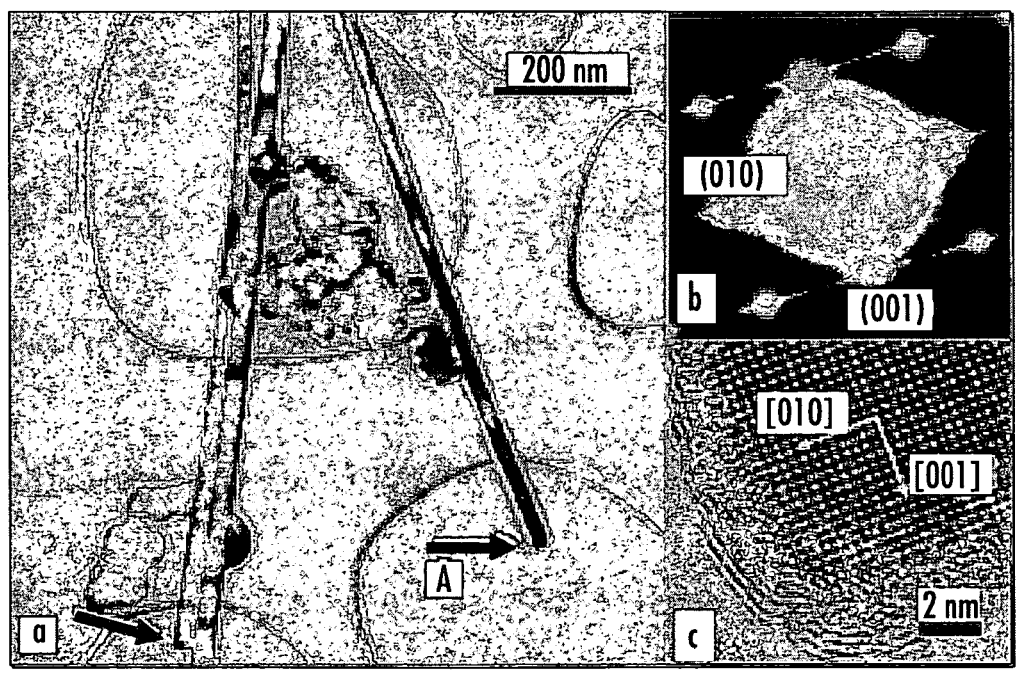
FIG. 2A is a low-magnification transmission electron microscope (TEM) image of $LaB_6$ nanowires synthesized according to the presently disclosed CVD method on a silicon substrate. The arrows point to the nanowire tips, which are flat.
FIG. 2B is an electron-diffraction pattern of the $LaB_6$ nanowire labeled by the arrow marked A in FIG. 2A. The streaks in the electron diffraction pattern are perpendicular to the axial direction of the nanowire.
FIG. 2C is a high-resolution TEM image of the nanowire tip described for FIG. 2B.

In some instances, the $LaB_6$ nanowires had flat tips. FIG. 2A shows the low-resolution image of three $LaB_6$ nanowires having flat tips, which formed at right angles to the stem (i.e., the longitudinal direction) of the nanowire. The $LaB_6$ nanowires shown in FIG. 2A were approximately 40 nm in lateral dimension, several micrometers in length, and had smooth sides. All of the diffraction spots in the electron diffraction pattern were elongated into streaks perpendicular to the [001] lattice direction, which indicated that the nanowire axis is parallel to the [001] direction of the $LaB_6$ crystal. See FIG. 2B. The diffraction pattern remained the same as the selected-area electron diffraction (SAED) aperture was moved along the entire nanowire, suggesting that the nanowire is single-crystalline. See Zhang, et al., *Adv. Mater.*, 18, 87-91 (2006).

Additional details of the structure of the $LaB_6$ nanowires were determined using high-resolution transmission electron microscopy (HRTEM). See FIG. 2C. In particular, the atomic-resolution image again indicates that the nanowire is parallel to the [001] crystallographic direction of the $LaB_6$ crystal and that a right angle is formed between the side surfaces and the tip, even at the atomic scale. Further, FIG. 2C shows that the $LaB_6$ nanowire tip is generally square shaped, but that the nanowire is surrounded by an amorphous layer.

Electron energy loss spectroscopy using a small electron-beam probe was used to determine the chemical composition of the amorphous layer covering the nanowire. Only boron and lanthanum was detected, suggesting that the layer comprises amorphous boron, which is the only potential amorphous phase possible based upon combinations of the two elements. Accordingly, the lanthanum signals were attributed to electron scattering from the crystalline part of the nanowire.

Figure 3:
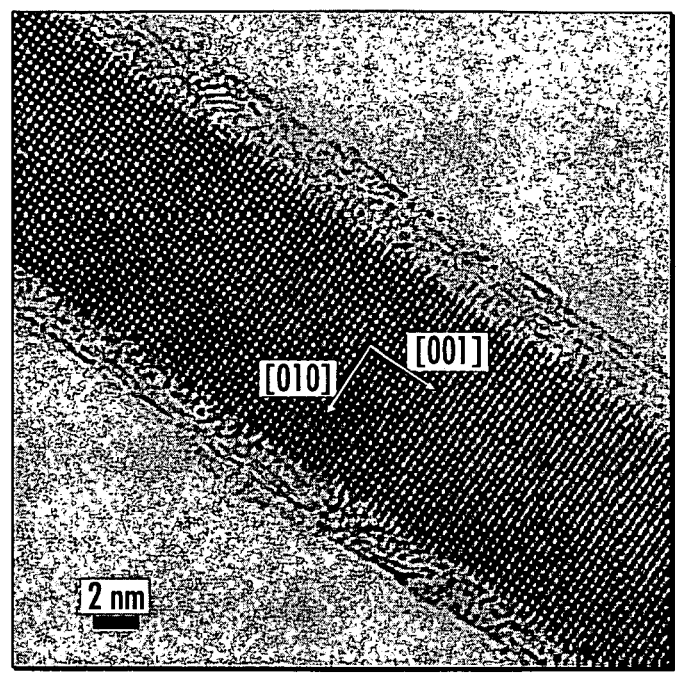
FIG. 3 is a high-resolution TEM image of a single-crystalline $LaB_6$ nanowire synthesized according to the presently disclosed CVD method on a silicon substrate. The arrows indicate lattice directions [001] (parallel to the longitudinal axis of the nanowire) and [010]. The width of the nanowire is approximately 15 nm.

In some cases, the LaB$_6$ nanowires had even smaller lateral dimensions, such as, for example, below 20 nm. FIG. 3 shows a HRTEM image of a nanowire having a lateral dimension of approximately 15 nm. FIG. 3 also shows that the growth direction of this smaller nanowire is parallel to the <001> lattice direction, and that all the surfaces of the nanowire terminate with {001} lattice planes. As the {001} lattice planes of the LaB$_6$ have the highest atomic density, the total energy for the crystal growth in the <001> direction is minimized. See Zhang, et al., *Adv. Mater.*, 18, 87-91 (2006).

Figure 4:
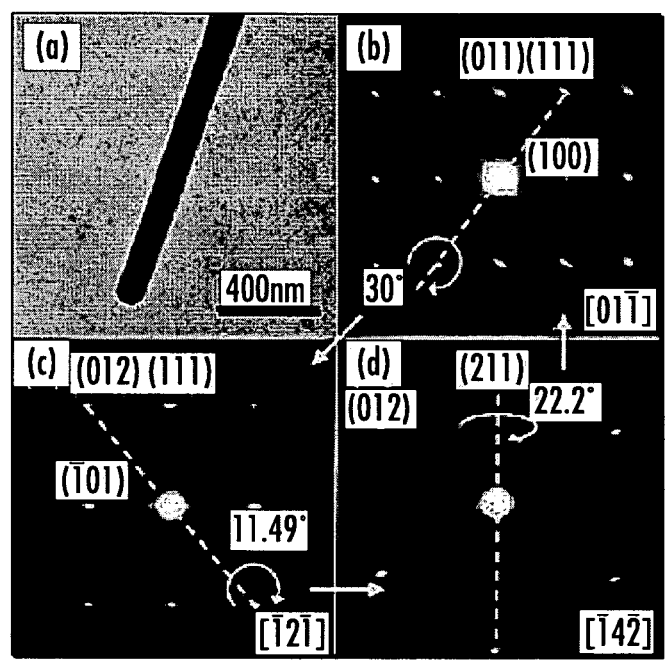
FIG. 4A is a low-resolution TEM image of a single-crystalline $LaB_6$ nanowire synthesized according to the presently disclosed CVD method on a iron- or platinum-coated silicon substrate.
FIG. 4B is an electron diffraction pattern of the nanowire shown in FIG. 4A, tilted to zone axis [01-1]. The dashed line indicates the tilting axis about which the nanowire can be rotated to obtain the orientation of the nanowire used to produce the electron diffraction pattern shown in FIG. 4C, while the circular arrow gives the tilting angle.
FIG. 4C is an electron diffraction pattern of the nanowire shown in FIG. 4A, tilted to zone axis [-12-1]. The dashed line indicates the tilting axis about which the nanowire can be rotated to obtain the orientation of the nanowire used to produce the electron diffraction pattern shown in FIG. 4D, while the circular arrow gives the tilting angle.
FIG. 4D is an electron diffraction pattern of the nanowire shown in FIG. 4A, tilted to zone axis [-14-2]. The dashed line indicates the tilting axis about which the nanowire can be rotated to obtain the orientation of the nanowire used to produce the electron diffraction pattern shown in FIG. 4B, while the circular arrow gives the tilting angle.

FIG. 4A shows a low magnification TEM image of another LaB$_6$ nanowire prepared according to the presently disclosed CVD method using a gold film-coated substrate and having a lateral dimension of less than 100 nm. FIGS. 4B-4D are electron diffraction patterns of the nanowire taken from three different crystal zone axes: [01-1] (FIG. 4B), [-12-1] (FIG. 4C), and [-14-2] (FIG. 4D). FIGS. 4B-4D also show the relative orientational relationship between the three diffraction patterns. The [-12-1] zone axis electron diffraction pattern was obtained by rotating the nanowire 30° about the [111] direction. The [-14-2] zone axis pattern was obtained by rotating the nanowire 11.490 about the [012] direction; and the [01-1] pattern was obtained by rotating the nanowire 22.2° about the [211] direction. All the reflection spots in the diffraction patterns were elongated to become streaks perpendicular to the [111] lattice direction, suggesting that the axis is parallel to the [111] direction of the LaB$_6$ crystal. The result was confirmed by HRTEM.

Figure 5:
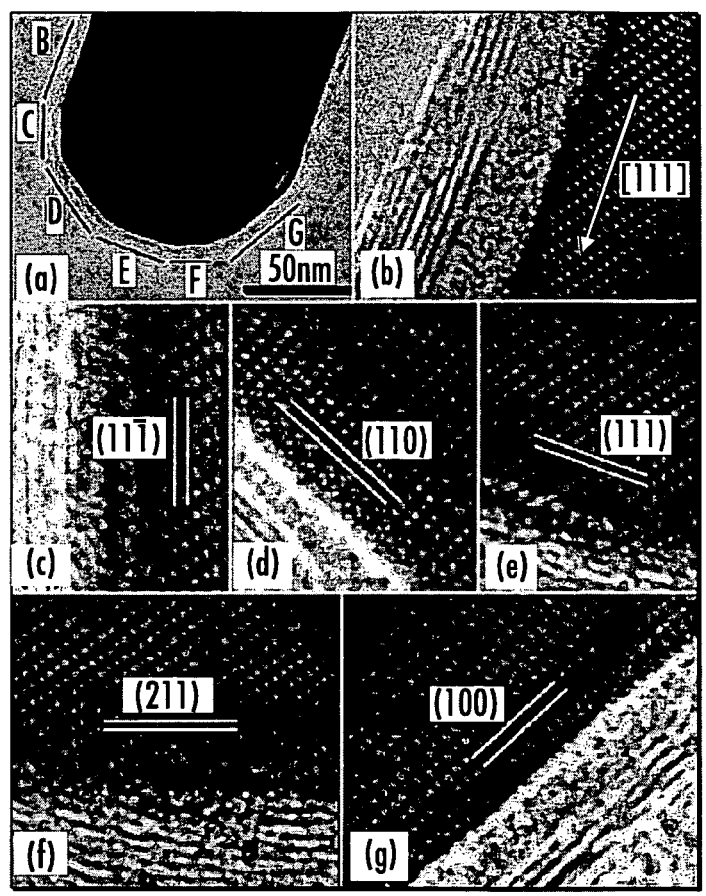
FIG. 5A is a high-resolution TEM image of the tip of the $LaB_6$ nanowire described for FIG. 4A. The letters B-G mark terminating facets of the nanowire tip (C-G) and stem (B).
FIG. 5B is a high-resolution TEM image of the facet marked B in FIG. 4A. The light-colored arrow indicates that the growth of the nanowire was oriented in the [111] direction.
FIG. 5C is a high-resolution TEM image of terminating facet C of the nanowire tip shown in FIG. 5A. As indicated by the light-colored double lines, terminating facet C has a (11-1) lattice plane.
FIG. 5D is a high-resolution TEM image of terminating facet D of the nanowire tip shown in FIG. 5A. As indicated by the light-colored double lines, terminating facet D has a (110) lattice plane.
FIG. 5E is a high-resolution TEM image of terminating facet E of the nanowire tip shown in FIG. 5A. As indicated by the light-colored double lines, terminating facet E has a (111) lattice plane.
FIG. 5F is a high-resolution TEM image of terminating facet F of the nanowire tip shown in FIG. 5A. As indicated by the light-colored double lines, terminating facet F has a (211) lattice plane.
FIG. 5G is a high-resolution TEM image of terminating facet G of the nanowire tip shown in FIG. 5A. As indicated by the light-colored double lines, terminating facet G has a (100) lattice plane.

As shown in FIG. 5A, in some cases, the LaB$_6$ nanowire tips were terminated in several different facets, indicated by the letters C-G, giving the tip an approximately hemispherical shape. FIG. 5B is a HRTEM image of plane B, a lattice plane from the stem area of the nanowire, showing that the axial direction of the nanowire is in the [111] direction, which is also the same as the growth direction of the nanowire. HRTEM analysis showed that the larger facets (i.e., D, E, and G) corresponded to (100), (110), and (111) lattice planes, while the two smaller facets (i.e., C and F) corresponded to (11-1) and (211) lattice planes. See FIGS. 5C-5G. Thus, it appears that higher indice planes appear only as transitions between dominant facet planes of low indice, agreeing with the lowest surface energy principle of crystal growth. While most commercial LaB$_6$ electron gun filaments are made along the <100> direction, in view of the lower work function and higher symmetry of the {100} plane, it is believed that a <111> oriented LaB$_6$ nanowire may be a good alternative emitter, as it should offer improved stability. See Zhang, et al., *J. Am. Chem. Soc.*, 127, 2862-2863 (2005).

Example 2

Chemical Vapor Deposition Formation of CeB$_6$ Nanowires

The synthesis of CeB$_6$ nanowires is based on the following equation:

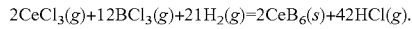

2CeCl$_3$(g)+12BCl$_3$(g)+21H$_2$(g)=2CeB$_6$(s)+42HCl(g).

The synthesis was conducted in a tube furnace at 1125° C. The BCl$_3$ gas was introduced into the reaction zone in a quartz tube. The CeCl$_3$ powders were vaporized in a quartz boat placed inside the tube furnace. The CeB$_3$ nanowires were deposited onto a platinum-coated silicon substrate placed in the tube furnace downstream of the quartz boat. See Zhang, H., et al., *J. Am. Chem. Soc.*, 127, 8002-8003 (2005).

Figure 6:
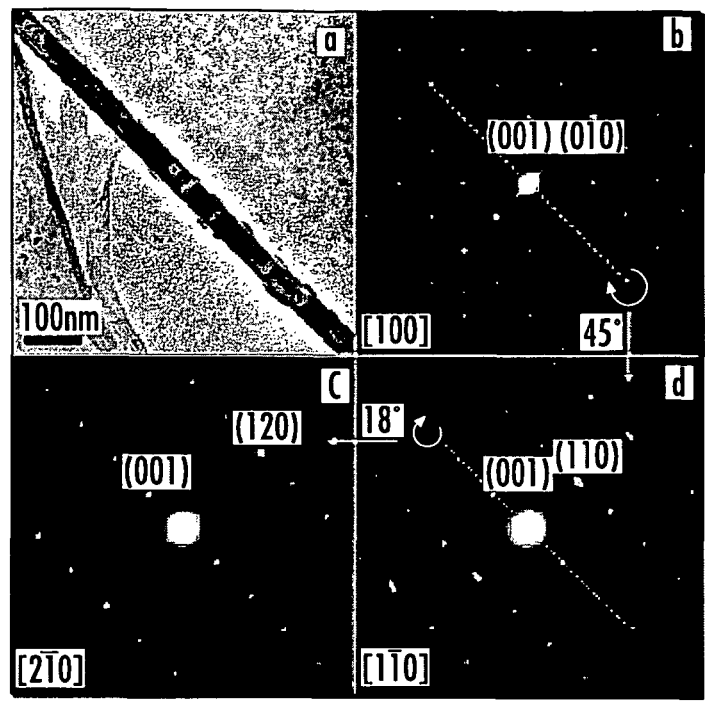
FIG. 6A is a low-magnification TEM image of a $CeB_6$ nanowire synthesized according to the presently disclosed CVD method using a platinum-coated silicon substrate.
FIG. 6B is an electron diffraction pattern of the $CeB_6$ nanowire shown in FIG. 6A, tilted to zone axis [100]. The dashed line indicates the tilting axis about which the nanowire can be rotated to obtain the orientation used to produce the electron diffraction pattern in FIG. 6D, while the circular arrow gives the tilting angle.
FIG. 6C is an electron diffraction pattern of the $CeB_6$ nanowire shown in FIG. 6A, tilted to zone axis [2-10].
FIG. 6D is an electron diffraction pattern of the $CeB_6$ nanowire shown in FIG. 6A, tilted to zone axis [1-10]. The dashed line indicates the tilting axis about which the nanowire can be rotated to obtain the orientation used to produce the electron diffraction pattern shown in FIG. 6C, while the circular arrow gives the tilting angle.

FIG. 6A shows a low-magnification image of a typical CeB$_6$ nanowire, having a lateral dimension of about 50 nm and a length of more than 10 μm. Energy-dispersive X-ray spectroscopy (EDX) analysis indicated that the nanowire comprised B and Ce. FIGS. 6B-6D show three electron diffraction patterns of the nanowire taken along three different crystal zone axes: [100] (FIG. 6B), [2-10] (FIG. 6C), [1-10] (FIG. 6D). To obtain the electron diffraction pattern in FIG. 6D, the nanowire was tilted 450 about its [001] direction as indicated by the arrow in FIG. 6B. To obtain the electron diffraction pattern in FIG. 6C, the nanowire was further tilted 18° about its [001] direction as shown by the arrow in FIG. 6D. As for LaB$_6$, the CeB$_6$ crystal lattice has a primitive cubic structure of space group Pm3m and a lattice constant of 0.4129 nm.

Figure 7:
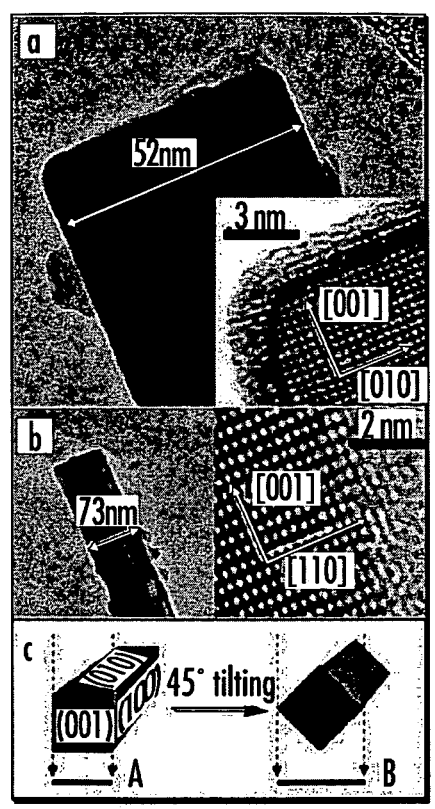
FIG. 7A is a [100] direction TEM image of a $CeB_6$ nanowire tip, having a lateral dimension of 52 nm. The inset is a high-resolution lattice image of the tip's upper left corner. The arrows in the inset indicate lattice directions [001] (parallel to the longitudinal axes of the nanowire) and [110].
FIG. 7B is a [1-10] direction TEM image of the nanowire described in FIG. 7A, having a lateral dimension of 73 nm. The right side of the figure is a high-resolution lattice image of the right-side wall of the nanowire.
FIG. 7C is a schematic drawing illustrating the 45° tilting process used to provide the orientation of the nanowire as shown in FIG. 7B starting from the orientation of the nanowire as shown in FIG. 7A. The dashed arrows indicate the direction in which the electron beam is incident with the projections indicated by the solid lines labeled A (for the projection corresponding to the image shown in FIG. 7A) and B (for the projection corresponding to the image shown in FIG. 7B).

FIG. 7A shows a TEM image of the tip of a CeB$_6$ nanowire, indicating that the nanowire has a flat tip with a lateral diameter of 52 nm. In the inset of FIG. 7A, a HRTEM image of the top left corner of the same CeB$_6$ nanowire suggests that the growth direction of the nanowire is along the [001] axis. Both the flat tip and the side surfaces of the nanowire terminate in {100} lattice planes.

FIG. 7B is a TEM image of the same CeB$_6$ nanowire after a 45° tilting about the axial direction. The projected width of the nanowire at this angle was 73 nm. The ratio of the width of the tilted nanowire with the width of the nanowire as shown in FIG. 7A is about 1.4, which suggests that the nanowire has a square cross-section. Another piece of evidence indicating that the nanowire has a square-shaped cross-section is the dark contrast line seen in FIG. 7B, aligned down the center of the nanowire's longitudinal axis. This contrast line indicates that the nanowire is thickest in the diagonal direction. The right-hand side of FIG. 7B shows the HRTEM image confirming that the nanowire is oriented in the [1-10] zone axis.

Morphological studies were carried out on several other CeB$_6$ nanowires prepared at the same time as the nanowire described in FIGS. 7A and 7B. In some cases, the CeB$_6$ nanowires had a rectangular-shaped cross-section and tip rather than a square-shaped one. In some instances, catalyst particles were sometimes seen at the end of the nanowires. Without being bound to any one theory, the presence of these catalyst particles suggests that the formation of the CeB$_6$ nanowires is a vapor-liquid-solid process.

Example 3

Chemical Vapor Deposition Formation of GdB$_6$ Nanowires

The synthesis of GdB$_6$ nanowires is based on the following equation:

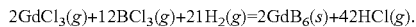

2GdCl$_3$(g)+12BCl$_3$(g)+21H$_2$(g)=2GdB$_6$(s)+42HCl(g).

The GdB$_6$ nanowires were synthesized by the same procedure described for the LaB$_6$ nanowires in Example 1, excepting that GdCl$_3$ powders were used in place of LaCl$_3$ and a clean silicon wafer served as the substrate. See Zhang, H., et al., *J. Am. Chem. Soc.*, 127, 13120-13121 (2005).

Initial examination of the nanowires using SEM indicated that the lateral dimensions of the nanowires ranged from below 100 nm to more than 1 μm, while EDX analysis indicated that the nanowires comprised B and Gd elements.

Figure 8:
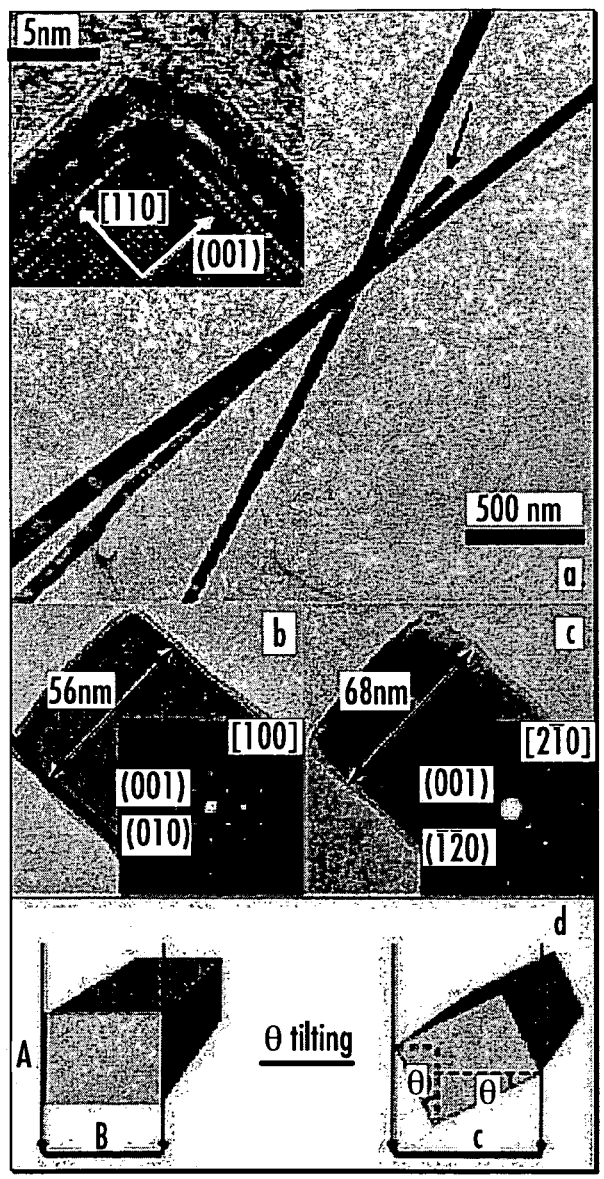
FIG. 8A is a TEM image of $GdB_6$ nanowires synthesized according to the presently disclosed CVD method. The inset is a high-resolution lattice image of a corner of the tip of the nanowire indicated by the arrow in the larger TEM image.
FIG. 8B is a TEM image of the nanowire tip described for the inset of FIG. 8A, taken along the [100] lattice direction. The inset of FIG. 8B is an electron diffraction pattern taken of the same nanowire.
FIG. 8C is a TEM image of the nanowire tip described for the inset of FIG. 8A, taken along the [1-20] lattice direction. The inset is an electron diffraction pattern taken of the same nanowire.
FIG. 8D is a schematic drawing illustrating the tilting process used to provide the orientation of the nanowire as shown in FIG. 8C starting from the orientation of the nanowire as shown in FIG. 8B. The arrows indicate the direction in which the electron beam is incident with the projections indicated by the solid lines labeled B (for the projection corresponding to the image shown in FIG. 8B) and C (for the projection corresponding to the image shown in FIG. 8C). B corresponds to one of the sides of the nanowire. A is a side of the nanowire adjacent to side B.

FIG. 8A shows the TEM image of three typical GeB$_6$ nanowires. These nanowires had lateral dimensions of about 50-60 nm and longitudinal dimensions of several microns.

The inset of FIG. 8A shows a high-resolution image of the tip of the nanowire indicated by the arrow in the larger image. The HRTEM image of the tip shows that the GeB$_6$ nanowire tip was flat and that the nanowire was grown along the <001> lattice direction. Both the tip and the side surfaces of the nanowire were terminated with {100} lattice planes.

Further morphological studies of the GdB$_6$ nanowires indicated that they had rectangle-shaped tips. FIG. 8B is the TEM image of a single GdB$_6$ nanowire taken along its [100] lattice direction, while FIG. 8C is the TEM image of the same nanowire taken along the [2-10] lattice direction. The insets of FIGS. 8B and 8C are the electron diffraction patterns of the nanowire in the two orientations. A schematic drawing representing the nanowire as oriented in both FIGS. 8B and 8C is shown in FIG. 8D. The solid line marked B in FIG. 8D represents the face of the nanowire shown in FIG. 8B. The solid line marked C in FIG. 8D represents the view of the nanowire shown in FIG. 8C.

The width of the nanowire face (B) in FIG. 8B was 56 nm. The width (C) of the nanowire as shown in FIG. 8C was 68 nm. Using these two widths along with the tilting angle ($\theta$) of 26.6°, a width of 40 nm for the face marked A in FIG. 8D could be calculated according to the equation:

$$A = (C - B \cos\theta)/\sin\theta.$$

Example 4

Field Emission of LaB$_6$ Nanowires

Figure 9A:
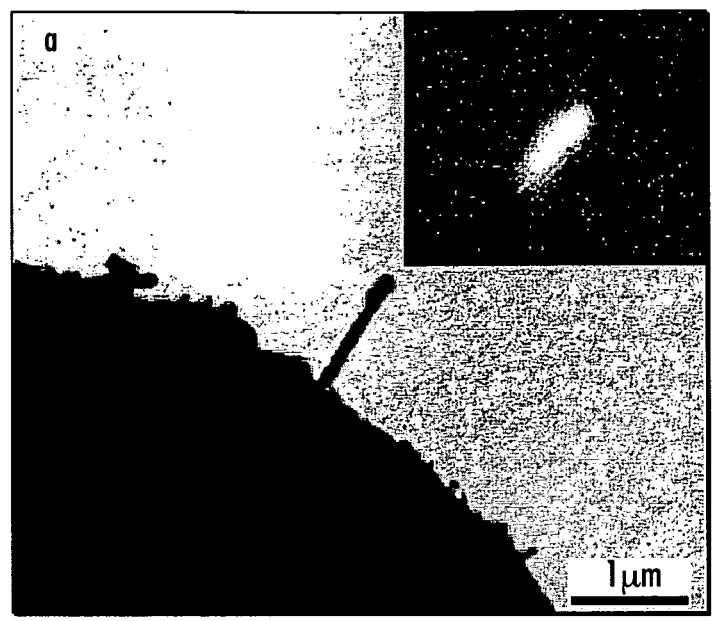
FIG. 9A is a low-magnification TEM image of a single $LaB_6$ nanowire field-emitter. The inset is a field emission pattern for the same emitter as recorded on a phosphor screen.

Field emission measurements were taken for an emitter comprising a LaB$_6$ nanowire. See Zhang et al., *Adv. Mater.* 18, 87-91 (2006). Briefly, the cathode comprised a 0.5 mm thick tungsten wire onto which was attached a single LaB$_6$ nanowire. The nanowire had a lateral dimension of 140 nm, a longitudinal dimension of about 1 µm, and was oriented in the [001] direction. FIG. 9A is a low-magnification TEM image of the LaB$_6$ single nanowire field-electron emitter. A piece of phosphor-coated indium tin oxide (ITO) glass plate was used as the anode. The phosphor coating allowed for observation of the electron-emission pattern of the electrons from the cathode when they reached the anode. Field emission measurements were carried out at a pressure of $10^{-7}$ torr in a high-vacuum chamber.

As increasing voltage was applied to the cathode, an electron fluorescent pattern was observed on the phosphor screen and recorded by a charge-coupled device (CCD) camera. A measurable field-emission current of 0.5 pA was obtained at an applied voltage of 450 V. This applied voltage corresponds to an average electric field of 1.5 V/µm. The average electric field was calculated by dividing the applied voltage by the cathode-anode separation, which was about 300 µm.

The emission pattern started to appear when the applied voltage reached 650 V. The inset of FIG. 9A shows the emission pattern. Without being bound to any one theory, it is believed that the elliptical shape of the emission pattern can be attributed to the emitter not being well aligned with respect to the electric field, which can cause the otherwise cylindrical electron beam to intercept the phosphor screen at an acute angle.

Figure 9B:
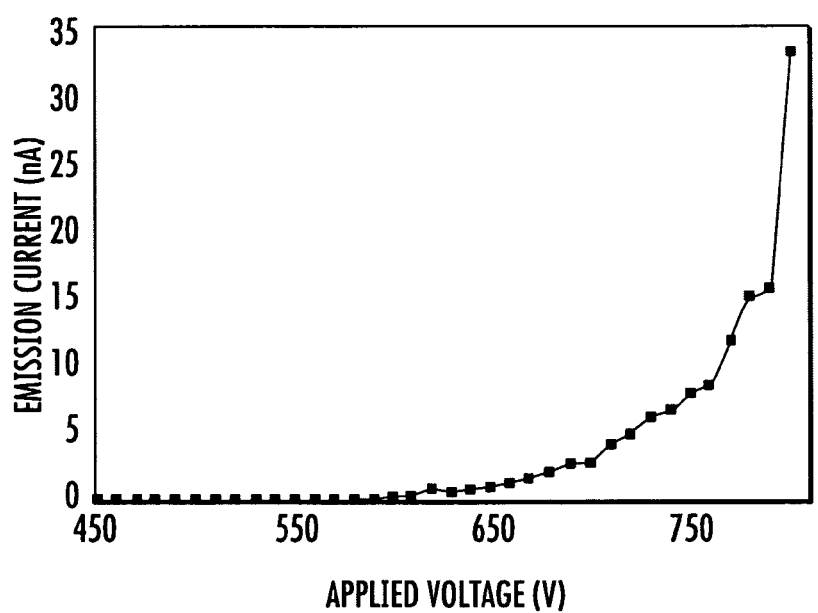
FIG. 9B is a plot showing the current-voltage (I-V) curve of the field emission from a single $LaB_6$ nanowire emitter.
Figure 9C:
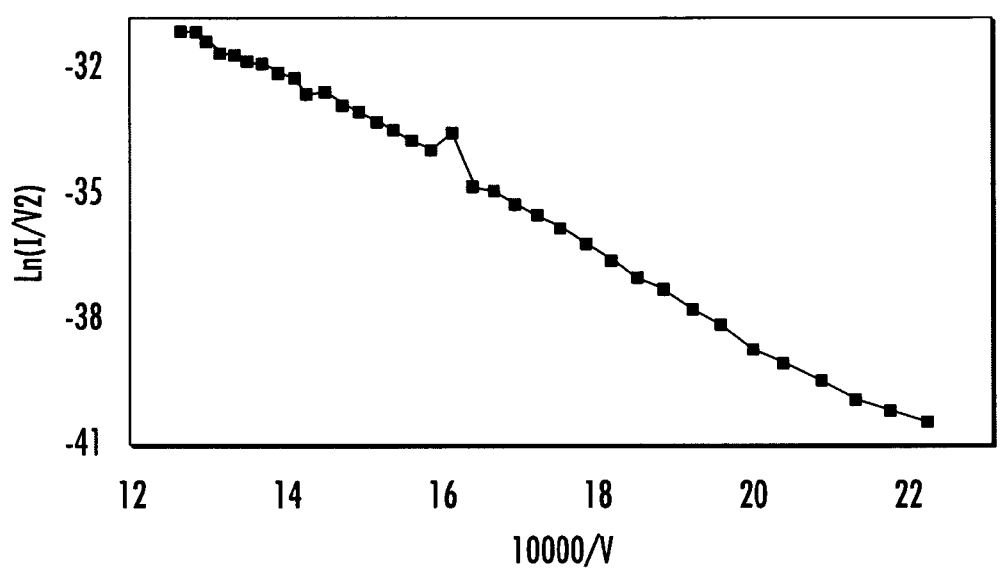
FIG. 9C is a Fowler-Nordheim plot of a single $LaB_6$ nanowire emitter.

An emission current-voltage (I-V) curve of the LaB$_6$ nanowire emitter is shown in FIG. 9B. FIG. 9C shows a Fowler-Nordheim (F-N) plot, $(\ln(I/V^2)$ vs. $1/V)$, for the field emission of the LaB$_6$ nanowire field emitter. The linearity of the plot is indicative that emission from the LaB$_6$ nanowire emitter agrees with the field emission model described by the Fowler-Nordheim equation. Four other F-N plots were obtained from the same nanowire emitter with a continuous emitting time duration of 30 min.

Assuming the work function of the [001] oriented LaB$_6$ emitter to be 2.6 eV, the slope (k) of the Fowler-Nordheim plot:

$$k = -6.44 \times 10^7 \phi^{3/2}/\beta$$

was used to estimate that the diameter of the emitter with an enhancement factor of $\beta = 1/5r$ was 152 nm. The effective emission area A was calculated to be 6.4 nm$^2$ by substituting $\beta$ and $\phi$ into the y-intercept b of the F-N plot as:

$$b = \ln\left[(1.5 \times 10^{-6} A \beta^2)/\phi + 10.4/\phi^{1/2}\right].$$

This area is smaller than the area of the entire tip, calculated to be about 200 nm$^2$.

By dividing the total emission current by the effective emission area, the emission current density at 800V was estimated to be about $5 \times 10^5$ A/cm$^2$. Thus, the LaB$_6$ field emitter, working at room temperature, appeared to be capable of producing a current density about one order of magnitude higher than a state-of-the-art W/ZrO thermal field emitter working at 1800° C. with a 3000V extraction voltage. See Zhang et al., *Adv. Mater.* 18, 87-91 (2006). Further, the current density of the LaB$_6$ emitter was of the same order of magnitude as that of a single-walled carbon nanotube bundle field emitter tested under the same experimental configuration, which displayed an estimated current density of $2.5 \times 10^5$ A/cm$^2$. See Zhang, et al., *Adv. Mater.*, 16, 1219-1222 (2004).

To assess the possible effects of an amorphous boron layer on the emission behavior of the LaB$_6$ nanowires, an amorphous boron nanowire having a diameter of about 170 nm was used to prepare a field emitter cathode having the same construction as the LaB$_6$ nanowire emitter cathode. The emission current of the boron nanowire emitter did not exceed 1 nA at applied voltages of up to 800 V. Presumably, the inferior emission behavior can be attributed to the higher work function of boron, which is 4.5 eV. The contrast between the two emitters suggests that the field emission from the LaB$_6$ nanowire emitter results mainly from the crystalline part of the nanowire.

Example 5

Field Emission of GdB$_6$ Nanowires

A single GdB$_6$ nanowire having a lateral dimension of about 200 nm was attached to the tip of an etched 0.5 mm tungsten nanowire using an acrylic adhesive. The nanowire-modified W tip was placed approximately 250 µM away from a phosphor-coated ITO glass anode. Field emission measurements were studied in a high-vacuum chamber at $10^{-7}$ torr. As an increasing electric voltage was applied, the emission current was measured and the emission patterns recorded with a CCD camera. See Zhang et al., *J. Am. Chem. Soc.*, 127, 13120-13121 (2005).

Figure 10A:
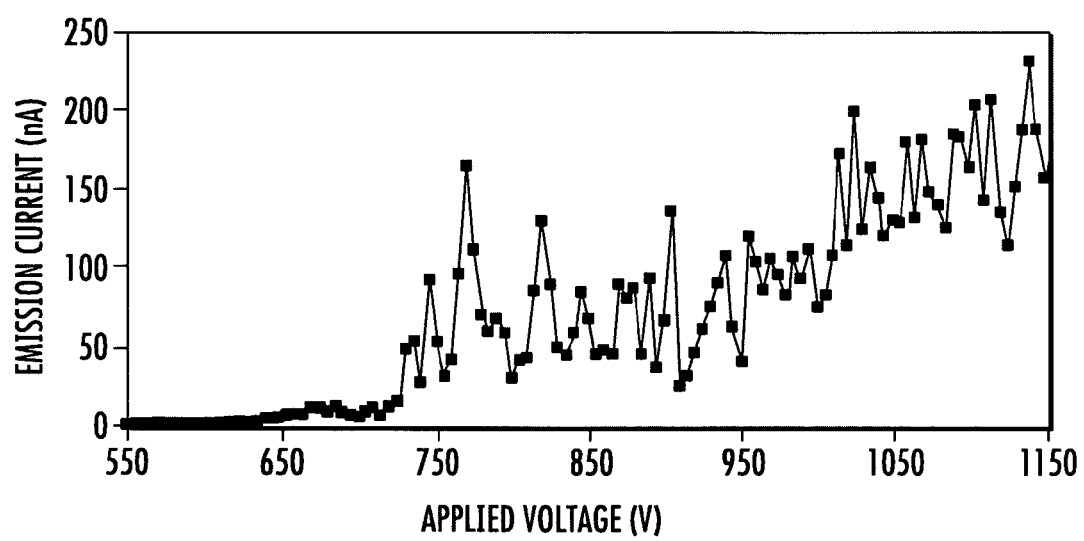
FIG. 10A is a plot showing the current-voltage (I-V) curve of the field emission from a single $GdB_6$ nanowire emitter.

FIG. 10A shows an emission current-voltage (I-V) plot of the field emission of the single GdB$_6$ nanowire emitter. At an applied voltage of 650 V, an emission current of 10 nA was obtained. At 750 V, the GdB$_6$ nanowire had an emission current of 50 nA, five times higher than that for the LaB$_6$ nanowire emitter at the same applied voltage. The emission current reached 200 nA before the emitter broke down.

During the emission process, the emitter surface reached a temperature of about 400° C. While this temperature is lower than the melting point of GdB$_6$, which is about 2510° C., it was much higher than the 60° C. temperature limit well tolerated by the acrylic adhesive. Therefore, without being bound to any particular theory, the current fluctuations observed in the plot shown in FIG. 10A are believed to be due to melting of the adhesive attaching the GdB$_6$ nanowire to the tungsten tip.

Figure 10B:
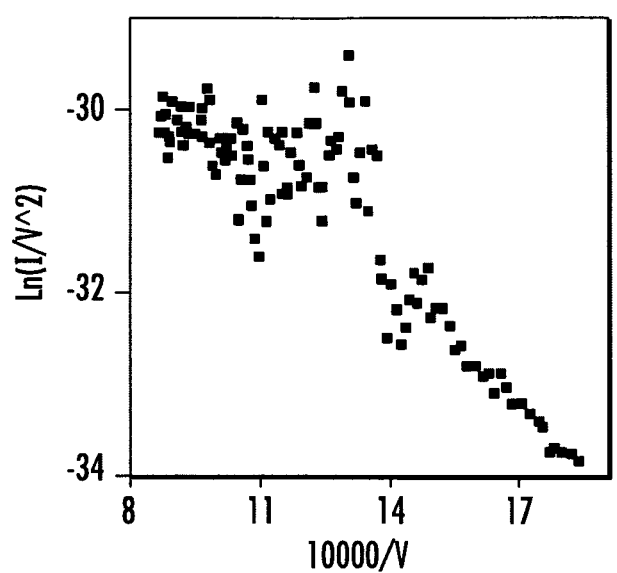
FIG. 10B is a Fowler-Nordheim plot of a single $GdB_6$ nanowire emitter.
Figure 10C:
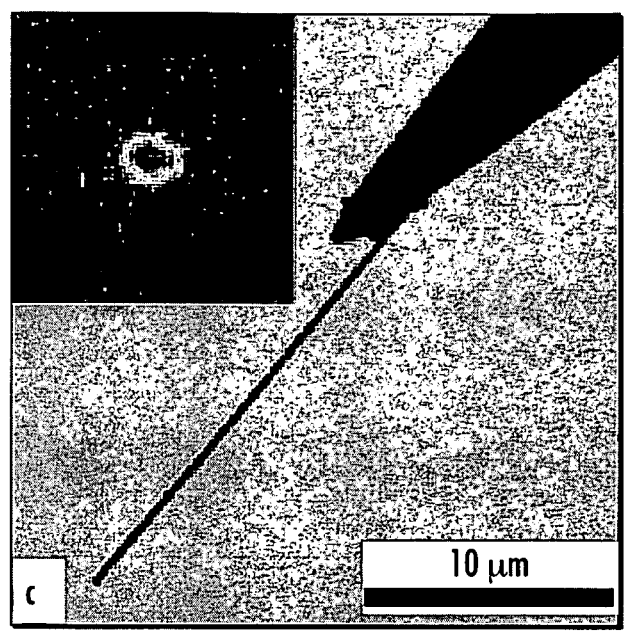
FIG. 10C is a low-magnification TEM image of a single $GdB_6$ nanowire field emitter. The inset is a field emission pattern of the same nanowire field emitter as recorded on a phosphor screen.

A Fowler-Nordheim plot (ln(I/V$^2$) vs 1/V) for the GdB$_6$ nanowire emitter is shown in FIG. 10B. A low-magnification TEM image of the GdB$_6$ field emitter is shown in FIG. 10C, while the inset of FIG. 10C shows the emission pattern recorded at an applied voltage of 750 V. The ring-like pattern is attributed to the enhancement of the local electric field at the edges and corners of the tip surface.

A numerical simulation using FEMLAB™ (Comsol A B, Stockholm, Sweden) software was carried out to determine the local electric field enhancement factor, which, in turn, was used to determine an experimental work function for GdB$_6$ of 1.53±0.2 eV. See Zhang et al., *J. Am. Chem. Soc.*, 127, 13120-13120 (2005).

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A method of preparing a single-crystalline, rare-earth metal hexaboride nanowire, the method comprising:
    providing a first gas comprising M(X$^1$)$_3$, wherein M is a rare-earth metal selected from the group consisting of Sc, Y, Ce, Pr, Nd, Sm, Eu, Gd, Tb, Dy, Ho, Er, Tm, Yb, and Lu and wherein X$^1$ is a halide, and wherein the first gas is provided by providing a solid comprising M(X$^1$)$_3$, and vaporizing the solid to form the first gas;
    providing a second gas, wherein the second gas comprises B(X$^2$)$_3$; wherein X$^2$ is a halide;
    providing a substrate; and
    contacting the first and second gases at a first temperature for a first period of time in the presence of a third gas, wherein said third gas comprises hydrogen gas, whereby the single-crystalline, rare-earth metal hexaboride nanowire deposits on a surface of the substrate.

2. The method of claim 1, wherein the nanowire has a lateral dimension of 200 nm or less.

3. The method of claim 2, wherein the nanowire has a lateral dimension of 100 nm or less.

4. The method of claim 3, wherein the nanowire has a lateral dimension of 60 nm or less.

5. The method of claim 4, wherein the nanowire has a lateral dimension of 20 nm or less.

6. The method of claim 1, wherein the nanowire has a longitudinal dimension of 100 nm or more.

7. The method of claim 6, wherein the nanowire has a longitudinal dimension of 1 μm or more.

8. The method of claim 7, wherein the longitudinal dimension is 10 μm or more.

9. The method of claim 1, wherein the nanowire has a lattice orientation selected from the group consisting of <001>, <110>, <111>, <112> and <113>.

10. The method of claim 1, wherein the nanowire has a tip comprising one or more terminating facets, further wherein at least one of the one or more facets comprises a lattice plane selected from the group consisting of a {100} plane, a {001} plane, a {110} plane, a {111} plane, a {112} plane, and a {113} plane.

11. The method of claim 1, wherein the nanowire has an approximately hemispherical tip surface.

12. The method of claim 1, wherein the nanowire has a flat tip.

13. The method of claim 12, wherein the flat tip is approximately square-shaped or rectangular-shaped.

14. The method of claim 1, wherein the vaporizing is done in the presence of the second and third gases.

15. The method of claim 1, wherein X$^1$ is Cl.

16. The method of claim 1, wherein X$^2$ is Cl.

17. The method of claim 1, wherein the first temperature ranges between about 800° C. and about 1500° C.

18. The method of claim 17, wherein the first temperature ranges between about 1125° C. and about 1150° C.

19. The method of claim 1, wherein the first period of time is less than one hour.

20. The method of claim 1, wherein the third gas comprises between about 5% H$_2$ gas by volume and about 100% H$_2$ gas by volume.

21. The method of claim 20, wherein the third gas further comprises nitrogen gas.

22. The method of claim 21, wherein the third gas comprises 5% H$_2$ by volume in nitrogen gas.

23. The method of claim 1, wherein M is selected from the group consisting of Gd, Y, Sm, and Ce.

24. The method of claim 1, wherein the contacting takes place inside a tube furnace.

25. The method of claim 1, wherein the contacting takes place at a pressure between about 0.05 atm and about 1 atm.

26. The method of claim 25, wherein the contacting takes place at a pressure of about 0.1 atm.

27. The method of claim 1, wherein the substrate comprises a material selected from the group consisting of silicon, doped silicon, metal, metal alloy, glass, graphite, diamond, ceramic, and mixtures thereof.

28. A method of preparing a single-crystalline, rare-earth metal hexaboride nanowire, the method comprising:
    providing a first gas comprising M(X$^1$)$_3$, wherein M is a rare-earth metal selected from the group consisting of Sc, Y, Ce, Pr, Nd, Sm, Eu, Gd, Tb, Dy, Ho, Er, Tm, Yb, and Lu and wherein X$^1$ is a halide;
    providing a second gas, wherein the second gas comprises B(X$^2$)$_3$; wherein X$^2$ is a halide;
    providing a substrate; and
    contacting the first and second gases at a first temperature for a first period of time in the presence of a third gas, wherein the first period of time ranges between about 2 minutes and about 7 minutes, and wherein said third gas comprises hydrogen gas, whereby the single-crystalline, rare-earth metal hexaboride nanowire deposits on a surface of the substrate.

29. A method of preparing a single-crystalline, rare-earth metal hexaboride nanowire, the method comprising:
    providing a first gas comprising M(X$^1$)$_3$, wherein M is a rare-earth metal selected from the group consisting of Sc, Y, Ce, Pr, Nd, Sm, Eu, Gd, Tb, Dy, Ho, Er, Tm, Yb, and Lu and wherein X$^1$ is a halide;
    providing a second gas wherein the second gas comprises B(X$^2$)$_3$; wherein X$^2$ is a halide;
    providing a substrate, wherein the substrate comprises a material selected from the group consisting of silicon, doped silicon, metal, metal alloy, glass, graphite, diamond, ceramic and mixtures thereof, and wherein the substrate is coated with metal; and
    contacting the first and second gases at a first temperature for a first period of time in the presence of a third gas, wherein said third gas comprises hydrogen gas, whereby the single-crystalline, rare-earth metal hexaboride nanowire deposits on a surface of the substrate.

30. The method of claim 29, wherein the substrate is coated by a metal selected from the group consisting of gold, iron, nickel, cobalt, and platinum.

31. A method of preparing a single-crystalline, rare-earth metal hexaboride nanowire, the method comprising:
- providing a first gas comprising $M(X^1)_3$, wherein M is a rare-earth metal selected from the group consisting of Sc, Y, Ce, Pr, Nd, Sm, Eu, Gd, Tb, Dy, Ho, Er, Tm, Yb, and Lu and wherein $X^1$ is a halide;
- providing a second gas, wherein the second gas comprises $B(X^2)_3$; wherein $X^2$ is a halide;
- providing a substrate, wherein the substrate is silicon or metal-coated silicon; and
- contacting the first and second gases at a first temperature for a first period of time in the presence of a third gas, wherein said third gas comprises hydrogen gas, whereby the single-crystalline, rare-earth metal hexaboride nanowire deposits on a surface of the substrate.

32. A method of preparing a single-crystalline, rare-earth metal hexaboride nanowire, the method comprising:
- providing a first gas comprising $M(X^1)_3$, wherein M is a rare-earth metal selected from the group consisting of Sc, Y, Ce, Pr, Nd, Sm, Eu, Gd, Tb, Dy, Ho, Er, Tm, Yb, and Lu and wherein $X^1$ is a halide;
- providing a second gas, wherein the second gas comprises $B(X^2)_3$; wherein $X^2$ is a halide;
- providing a substrate;
- providing a catalyst, wherein the catalyst comprises a material selected from the group consisting of a transition metal, a noble metal, and combinations thereof; and
- contacting the first and second gases at a first temperature for a first period of time in the presence of a third gas, wherein said third gas comprises hydrogen gas; whereby the single-crystalline, rare-earth metal hexaboride nanowire deposits on a surface of the substrate.

* * * * *